United States Patent [19]
Tay

[11] Patent Number: 5,406,520
[45] Date of Patent: Apr. 11, 1995

[54] UNIVERSAL MODULAR MEMORY

[75] Inventor: Cheng H. Tay, Singapore, Singapore

[73] Assignee: Texas Instruments Incorporated, Dallas, Tex.

[21] Appl. No.: 123,389

[22] Filed: Sep. 20, 1993

Related U.S. Application Data

[63] Continuation of Ser. No. 753,292, Aug. 30, 1991, abandoned.

[51] Int. Cl.⁶ .............................................. G11C 7/00
[52] U.S. Cl. .................... 365/200; 365/225.7; 365/230.03; 365/230.06
[58] Field of Search ............... 365/200, 230.03, 225.7, 365/230.02, 230.06; 371/11.1, 10.2

[56] References Cited
U.S. PATENT DOCUMENTS
4,604,730  8/1986  Yoshida et al. ..................... 365/200

Primary Examiner—Joseph A. Popek
Attorney, Agent, or Firm—Theodore D. Lindgren; Leon N. Heiting; Richard L. Donaldson

[57] ABSTRACT

In accordance with one embodiment of the invention, an integrated circuit memory capable of receiving address signals has a plurality of array modules. Each array module has a plurality of memory cells arranged in rows and columns and has a means for addressing the rows and columns of the array modules in response to the address signals. The integrated memory includes a circuit for de-coupling an input address signal from array modules and for coupling of a fixed address signal to the array modules, allowing the conversion of the integrated circuit memory to a universal modular memory.

18 Claims, 4 Drawing Sheets

UNIVERSAL MODULAR MEMORY

This application is a continuation of application Ser. No. 07/753,292, filed Aug. 30, 1991, now abandoned.

BACKGROUND OF THE INVENTION

This invention relates to semiconductor memory devices and, more particularly, to modification of integrated circuit memories, such as Dynamic Random Access Memories (DRAMs), to become universal modular memories.

In general, semiconductor memory devices, such as DRAMs, are formed from sub-arrays, or modules, of memory cells. For example, a four-megabit DRAM may be formed on a chip using four modules, each module including one million memory cells.

The memory cells of each array module are formed in rows and columns. Each memory cell in a row is connected to a conductive row line and each memory cell in a column is connected to at least one conductive column line. Row addresses are applied to the row lines and column addresses are applied to the column lines for the purpose of storing and reading digital data in the memory cells and, in the case of DRAMs, refreshing the memory cells. The digital data are sensed by sense amplifiers connected to the column lines of each module.

The number of row address bits received by a DRAM from a microprocessor may, by industry standard, be equal to the number of column address bits. For example, the row address signals and the column address signals furnished by a microprocessor to a four-megabit DRAM may each have 11 bits. However, the information from the column address bits and from the row address bits may be redefined to conform to the array module configuration. In redefining the bits, one or more of the row bits may be assigned to address one or more columns in a module or modules of cells. Similarly, one or more of the column bits or the row bits may be assigned to designate a particular module in which data may be stored or read. For example, one row bit may designate whether a top module or a bottom module is being read. One column bit may designate whether a left module or a right module is being read.

Modular DRAMs (MODRAMs) are DRAMs that, because of manufacturing defects, have one or more modules that are defective. DRAMs are tested at the wafer stage of manufacture to identify which module or modules of the DRAM are functional and which are defective. Because of the random nature of defects, the functional modules of a MODRAM may assume many possible configurations, dependent on which module or modules of the array are defective. For example, either the top module(s) or the bottom module(s) may be functional. In other cases either the left module(s) or the right module(s) may be functional. However, system designers generally must specify address and pin connections for circuit systems using MODRAMs. In the past, this has meant that MODRAMs must be categorized and sold, for example, as top-array-module functional only or as bottom-array-module functional only. Therefore, a designer could design a particular system to use only one or the other of the categories because the DRAM assigned pin address may, for example, be RA10=0 for top module or modules and, using the same example, pin address RA10=1 may be assigned to the bottom module or modules of the DRAM.

There is a need for a universal memory circuit comprised of functional modules at a variety of locations, yet the memory circuit is alterable to have the same pin-address specification regardless of the variety of locations.

SUMMARY OF THE INVENTION

In accordance with one embodiment of the invention, an integrated circuit memory capable of receiving address signals has a plurality of array modules. Each array module has a plurality of memory cells arranged in rows and columns and has a means for addressing the rows and columns of the array modules in response to the address signals. In one embodiment, a circuit is provided to allow, for example, the use of a laser to disconnect the RA10 pin from internal circuitry and to "hard wire" the RA10 pin address to either 0 or 1 depending on whether the top or the bottom array module is functional. Therefore, the use of the top or bottom array module is transparent to the system microprocessor. In addition, the designed system may use MODRAMs, or other memory arrays, having several combinations of modules that are functional, yet the different combinations are transparent to the system microprocessor. The invention eliminates the need to segregate MODRAMs, or other memory arrays, for sale and use according to the location of functional modules.

DETAILED DESCRIPTION OF SPECIFIC EMBODIMENTS

Figure 1:
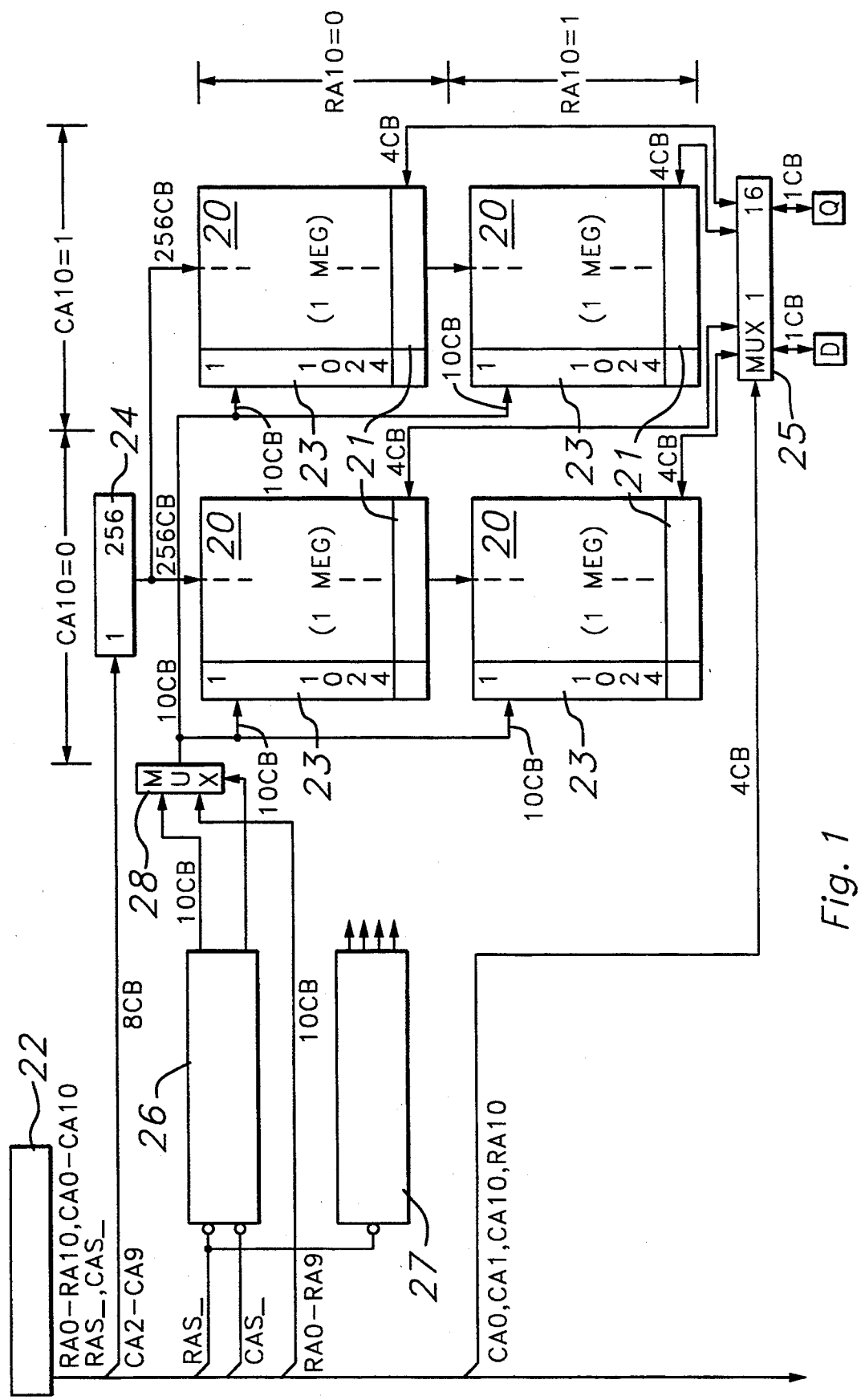
FIG. 1 is a schematic circuit representation, in partial block form, of relevant parts of an example, prior-art-type dynamic random access memory (DRAM)

Referring to FIG. 1, a prior-art-type memory device is illustrated in block diagram form. The memory device used for illustration purposes is a random access, read/write memory of the dynamic type, made by a N-channel, self-aligned, silicon gate CMOS process. The example DRAM device includes 4,194,304 memory cells split into four ARRAY MODULEs 20 of 1,048,576 cells each, each ARRAY MODULE 20 having a regular pattern of 1024 rows and 1024 columns. There are 1024 sense amplifiers (SENSEAMPS 21) in each ARRAY MODULE 20, each sense amplifier connected to a column line.

In the prior-art, it is common for a MICROPROCESSOR 22 to furnish, for example, eleven row or X addresses RA0–RA10 and eleven column or Y addresses CA0–CA10 to a memory chip having 4,194,304 memory cells. Many memory chips, such as that of the example circuit of FIG. 1, have a different number of columns than the number of rows (a column connected in parallel with another column is counted as a single column). In the FIG. 1 example, one of the row addresses, RA10, is treated as a column address. Therefore, the device of FIG. 1 is arranged to utilize a ten-bit row address RA0–RA9 and twelve-bit column address CA0–CA10,RA10. The ten-bit row address RA0–RA9 is applied to the inputs of each of the four 1-of-1024 row decoders 23 by a ten-conductor bus 10CB. The row decoders 23 function to select 1-of-1024 row lines of each array as defined by the ten-bit row address RA0–RA9. One corresponding row line in each ARRAY MODULE 20 is selected by the same ten-bit row address RA0–RA9.

Eight bits CA2–CA9 of the twelve-bit column address CA0–CA10,RA10 are applied to the input of 1-of-256 column decoder 24 by an eight-conductor bus 8CB. The column decoder 24 functions to select a group of 4-of-1024 columns in each of the four ARRAY MODULEs 20, the group of four columns defined by the eight-bit column address CA2–CA9. A corresponding group of four columns is selected in each ARRAY MODULE 20 by the same eight-bit column address CA2–CA9.

The 4-of-1024 selection (or the one-group-of-256-groups selection) made by the column decoder 24 causes each corresponding group of four columns in each array to be coupled by a four-conductor bus 4CB to a 1-of-16 multiplexer (MUX) 25. The 1-of-16 multiplexer 25 selects one column of the sixteen columns, based on a received signal containing four bits CA0,CA1,CA10,RA10 of the twelve-bit column address CA0–CA10,RA10 and couples the data of the selected column through the one-conductor bus 1CB to the data input/output terminal D or Q. As is well-known, DRAMs may be configured such that MUX 25 selects, for example, four of the sixteen columns or eight of the sixteen columns provide four or eight output bits in parallel to multiple D/Q terminals.

The row address RA0–RA9 must appear at the row decoders 23 when a row address strobe signal RAS_ is applied to an input of the REFRESH DETECTOR AND COUNTER circuit 26 and to the ROW CLOCKS circuit 27, the latter of which generates a large number of clock and control signals to define the operation of various parts of the device of each ARRAY MODULE 20. Likewise, a column address strobe signal CAS_ is applied to the REFRESH DETECTOR AND COUNTER circuit 26. The CAS_ signal causes column address CA2–CA9 to appear at the column decoder 24 of the memory chip. Signals derived from the RAS_ signal and the CAS_ signal cause the memory cells of each ARRAY MODULE 20 to be refreshed (cause the capacitors of the cells to be recharged). REFRESH DETECTOR AND COUNTER circuit 26 provides a REFRESH CYCLE signal to a multiplexer (MUX) 28, which in turn provides row address signals RA0–RA9 to the row decoders 23 of each ARRAY MODULE 20. It should be noted that the schematic circuitry for the column refresh signals is not shown in FIG. 1. However, such circuitry is well-known in the prior-art and is described, for example, in U.S. Pat. No. 4,670,878 issued Jun. 2, 1987 and in U.S. Pat. No. 4,969,123 issued Nov. 6, 1990, both of which are assigned to Texas Instruments Incorporated.

While the RAS_ and CAS_ signals are illustrated in FIG. 1 as being furnished by MICROPROCESSOR 22, those signals may be generated on the DRAM chip itself or may be furnished by an intermediate chip, as is well-known in the art.

As shown at the right side of FIG. 1, the columns of ARRAY MODULE 0 and ARRAY MODULE 1 are selected for reading by address RA10=0, while the columns of ARRAY MODULE 2 and ARRAY MODULE 3 are selected for reading by address RA10=1. Similarly, as shown at the top of FIG. 1, the columns of ARRAY MODULE 0 and ARRAY MODULE 2 are selected for reading by address CA10=0, while the columns of ARRAY MODULE 1 and ARRAY MODULE 3 are selected for reading by address CA10=1.

At the wafer stage of production, before the protective overcoat deposition, a DRAM chip is tested prior to making any necessary laser repairs. The test at this stage is commonly referred to as the pre-laser test. The pre-laser test may, for example, result in laser repair to replace defective columns or rows of memory cells with redundant columns or rows. After any laser repair is performed, the DRAM chip goes through a protective overcoat deposition. After the overcoat deposition, a multi-probe test is performed.

The pre-laser test determines whether or not a DRAM chip is fully functional and, if the DRAM is partially functional, determines which of the ARRAY MODULEs 20 of the DRAM array are functional.

Figure 2:
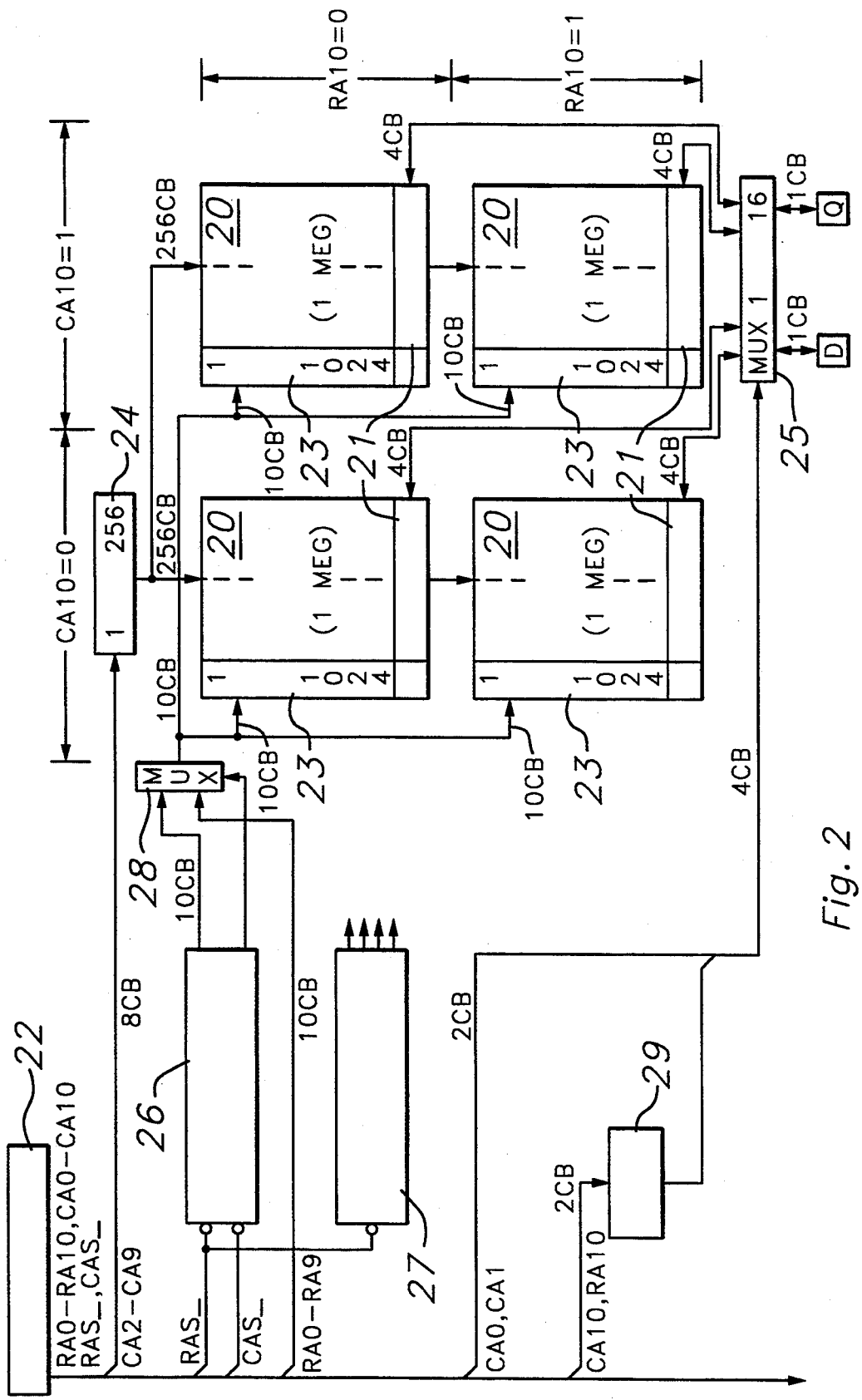
FIG. 2 is a schematic circuit representation, in partial, block form, illustrating use of the switching circuit of this invention in the example DRAM of FIG. 1.

Referring now to FIG. 2, the circuit of FIG. 1 has been modified to utilize the fact that, when RA10=1, when RA10=0, when CA10=1, or when CA10=0, only one half of the ARRAY MODULEs 20 are utilized. As explained in detail herein, the circuit of FIG. 2 includes a circuit means 29 for cutting off the external connection to, for example, the RA10 address and for connecting the RA10 address to either 0 or 1 permanently, depending on whether the top ARRAY MODULEs 20 or the bottom ARRAY MODULEs 20 are functional.

It should be noted that pins may be used for more than one purpose. For example, the same pin of a DRAM may be used for both column and row addresses. Therefore, as used herein, the term "external" in reference to an addressing signal means the location after the input address buffer where that address signal is segregated.

Figure 3:
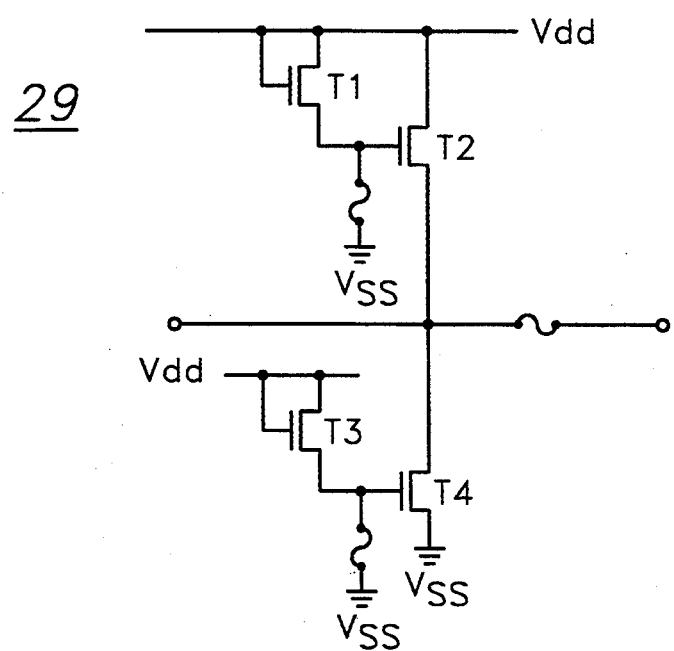
FIG. 3 is a schematic circuit representation of a fused switch for use with a modular memory.

Referring now to FIG. 3, an embodiment of circuitry 29 of FIG. 2 is illustrated. Each of the fuses of the circuit of FIG. 3 can be open-circuited, for example, by a laser. FUSE X is open-circuited to cut off the external address RA10, assuming that the specification for the universal memory calls for address RA10 to be inoperative. FUSE B is open-circuited for MODRAMs in which the bottom ARRAY MODULEs 20 are functional. In that case, transistors T1 and T2 cause the voltage at INTERNAL RA10 to be the supply voltage Vdd, i.e. RA10=1. FUSE T is open-circuited for MODRAMs in which the top ARRAY MODULEs 20 are functional. In that case, transistors T3 and T4 cause the voltage at INTERNAL RA10 to be reference voltage Vss, i.e., RA10=0.

The circuit of FIG. 3 is but one of many circuits that may be used to perform the function described. Other circuits might, for example, use fuses that are short-circuited rather than open-circuited, or might use nonvolatile programmable memory elements. If nonvolatile memory elements are used, the programming to alter the memory to become a universal modular memory can be performed after the multi-probe test, or even after the post-package test.

The concept of transparency to the microprocessor extends to other functional-array configurations and to other addresses.

For example, if it is specified to MODRAM circuit designers that the RA10 address is a universal "don't care" address, then circuitry may be included that makes MODRAMs having left-functional or right-functional ARRAY MODULEs 20 to operate with the same input addresses as top-functional or bottom-functional MODRAMs. As illustrated in FIGS. 1 and 2, the left side of the DRAM is addressed with CA10=0 and the right side of the DRAM is addressed with CA10=1. If either the left or right ARRAY MODULEs 20 of the DRAM are functional, then to make the MODRAM transparent to the microprocessor 22, which treats RA10 as a "don't care" address, the MODRAM must have "external CA10" rechanneled to be used as "internal RA10". In addition, "external RA10" must again be cut off from any internal addressing connections. Also "internal CA10" must now be "hard wired" to either 0 or 1 depending on whether the left or right side of the DRAM is used.

Figure 4:
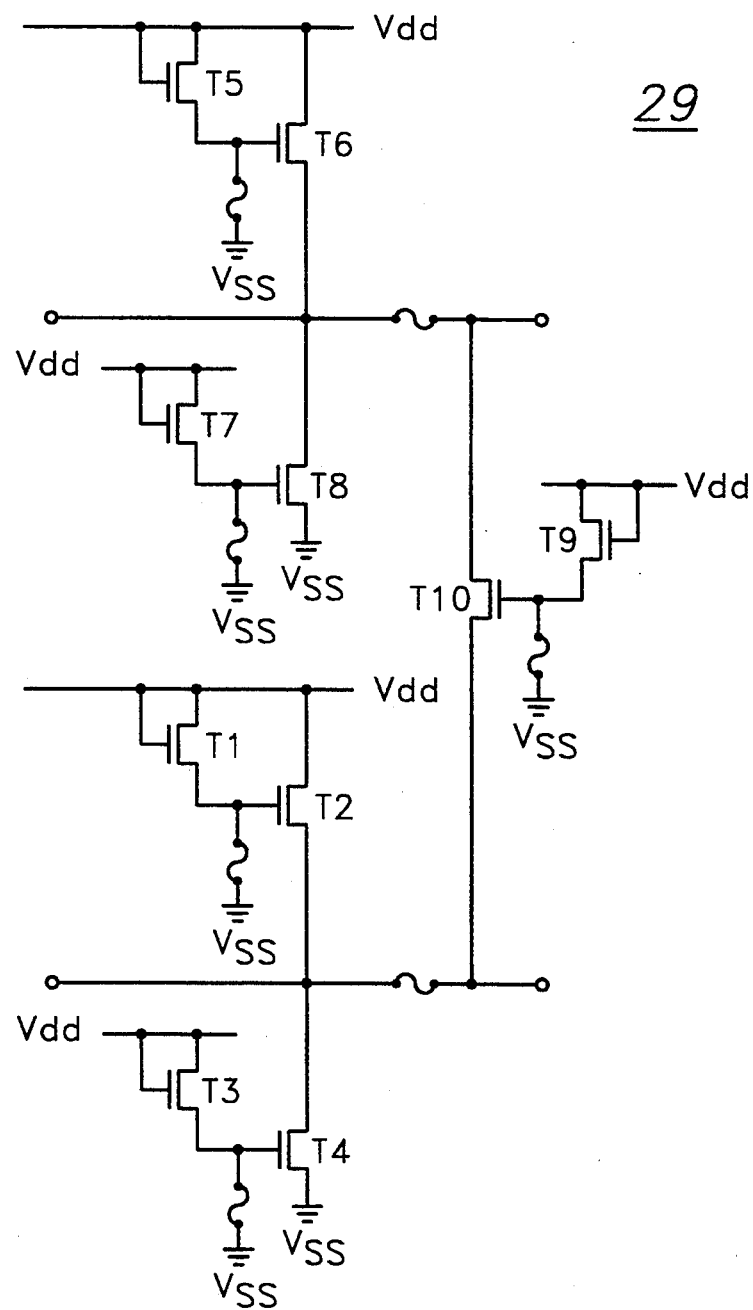
FIG. 4 is a schematic circuit representation of a second fused switch for use with a modular memory.

FIG. 4 illustrates an example of a circuit that may be used to make a DRAM into a universal MODRAM. The circuit of FIG. 3 has been modified to utilize the fact that when RA10=1 and when CA10=1 only ARRAY MODULE 3 is being utilized, that when RA10=1 and when CA10=0 only ARRAY MODULE 2 is being utilized, that when RA10=0 and CA10=1 only ARRAY MODULE 1 is being utilized, and that when RA10=0 and CA10=0 only ARRAY MODULE 0 is being utilized. As in the fuse circuit of FIG. 3, FUSE X is open-circuited for all MODRAMs to cut off the external address RA10. For left or right functional MODRAMs, FUSE Y is open-circuited to cut off EXTERNAL CA10 from INTERNAL CA10. Either FUSE R or FUSE L is open-circuited to select use of either right-functional or left-functional array MODRAMs through use of transistors T5 and T6 or use of transistor T7 and T8 as explained in reference to the circuit of FIG. 3. In addition, FUSE C is open-circuited to cause transistors T9 and T10 to redirect the external address CA10 to the internal conductor for address RA10. Using the circuit of FIG. 4, either the top or bottom half of the DRAM is usable, assuming that one of those two halves is functional. If not, either the left or right half of the DRAM is usable, assuming that one of those two halves is functional.

The same concept may be used on many other combination of functional ARRAY MODULEs 20 to form MODRAMs of various capacities. The ARRAY MODULEs 20 need not be physically separated arrays of cells, but may be parts of one large array of cells.

An advantage of this invention is the allowance of a universal pin-connection specification for each category of MODRAMs, e.g., half-megabit or two megabit. The universal specification reduces specification requirements for circuit designers. In addition, testing of DRAMs by the manufacturer after laser repair is simplified. Manufacture flow and inventory are simplified because there are fewer types of MODRAMs to track. Higher yields are attained because there is no need to discard chips having functional ARRAY MODULE 20 maps that are not specified by circuit designers.

The circuitry described above requires minimal area on a memory chip. The addition of more fuses and laser repairs has a minimal impact on reliability. However, testing with complete topological scrambling is not possible for MODRAMs that have addresses rerouted by laser repair. The latter fact results in some difficulty during testing correlation.

In summary, an integrated circuit memory, such as a DRAM capable of receiving row address signals RA0-RA10 and column address signals CA0-CA10, has a plurality of ARRAY MODULEs 20. Each ARRAY MODULE 20 includes a plurality of memory cells arranged in rows and columns and includes at least one sense amplifier (SENSEAMPS 21). The integrated circuit memory also includes a means, such as row decoders 23 and column decoder 24, for addressing the rows and columns of the ARRAY MODULEs 20 in response to the address signals RA0-RA10 and CA0-CA10. In addition the integrated circuit memory includes a means 29 for disconnecting a row or column address and for rerouting the signal of a row or column address.

While the embodiment described herein is a DRAM integrated circuit, it should be noted that the invention is also applicable to other integrated circuits, such as nonvolatile memories arranged in modules of memory cells.

While the invention has been described with reference to an illustrative embodiment, this description is not intended to be construed in a limiting sense. Various modifications of the illustrative embodiment, as well as other embodiments of the invention, will be apparent to persons skilled in the art upon reference to the description. It is, therefore, intended that the appended claims encompass any such modifications or embodiments.

I claim:

1. Conversion circuitry for converting an integrated circuit memory capable of receiving a total number of address signals to a universal modular memory for receiving at least one less said total number of address signals, said integrated circuit before conversion including a plurality of array modules, each array module having a plurality of memory cells arranged in rows and columns, said total number of address signals providing approximately one address for each of said memory cells in said integrated circuit memory; and including decoder circuitry coupled to receive said total number of address signals, said decoder circuitry having outputs routing data corresponding to each said cell of each said array module in response to coupling of each of said total number of address signals to said decoder circuitry; said conversion circuitry comprising:

first altering circuitry for permanently de-coupling at least one of said total number of address signals from said decoder circuitry;

second altering circuitry for applying a deactivating signal to said decoder circuitry to deactivate permanently at least one said module.

2. The integrated circuit memory of claim 1, wherein at least one of said array modules is defective.

3. The integrated circuit memory of claim 1, wherein at least one of said array modules is defective and wherein said deactivating signal permanently deactivates said defective array module.

4. The integrated circuit memory of claim 1, wherein at least one of said first altering circuitry and said second altering circuitry includes a fuse.

5. The integrated circuit memory of claim 1, further including third altering circuitry for de-coupling permanently a second of said total number of address signals from one input to said decoder circuitry and for re-coupling said second of said total number of address signal to a second input of said decoder circuitry.

6. The integrated circuit memory of claim 1, further including third altering circuitry for re-routing a second said address signal to said decoder circuitry, wherein said third altering circuitry includes a pair of fuses.

7. The integrated circuit memory of claim 1, wherein said decoder circuitry includes a row decoder and a column decoder.

8. The integrated circuit memory of claim 1, wherein said integrated memory is a dynamic random-access memory.

9. The integrated circuit memory of claim 1, wherein said address signals are furnished by a microprocessor.

10. The integrated circuit memory of claim 1, wherein at least one of said array modules includes at least one of a redundant row or column of cells.

11. A method for converting a memory having a number of array modules to a universal modular memory having a lesser said number of operating array modules, each array module having a plurality of memory cells arranged in rows and columns, said memory capable of receiving prior to conversion a total number of address signals providing approximately one address for each of said memory cells, said memory receiving after conversion at least one less than said total number of address signals, said memory including decoder circuitry coupled to receive said address signals, said decoder circuitry having outputs routing data corresponding to each said cell of each said array module in response to said address signals, said method comprising:

de-coupling permanently at least one less than said total number of said address signals from said decoder circuitry;

applying a deactivating signal to said decoder circuitry to deactivate permanently at least one said array module; and if necessary, re-routing one of said total number of address signals to said decoder circuitry.

12. The method of claim 11, wherein said integrated circuit memory is a dynamic random access memory.

13. The method of claim 11, wherein said address signals are furnished by a microprocessor.

14. The method of claim 11, wherein at least one of said array modules is defective.

15. The method of claim 11, wherein at least one of said array modules is defective and wherein said deactivating signal inactivates said defective array module.

16. The method of claim 11, wherein said re-routing is performed by using a laser beam to open-circuit at least one fuse.

17. The method of claim 11, wherein said de-coupling is performed by using a laser beam to open-circuit at least one fuse.

18. The method of claim 11, wherein said applying a deactivating signal to said decoder circuitry is performed by using a laser beam to open-circuit at least one fuse.

* * * * *